United States Patent
Chen et al.

(10) Patent No.: US 6,680,838 B2
(45) Date of Patent: Jan. 20, 2004

(54) ELECTROSTATIC DISCHARGE PROTECTION CIRCUIT

(75) Inventors: Shiao-Shien Chen, Chung-Li (TW); Tien-Hao Tang, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 123 days.

(21) Appl. No.: 10/063,076

(22) Filed: Mar. 17, 2002

(65) Prior Publication Data

US 2003/0184942 A1 Oct. 2, 2003

(51) Int. Cl.[7] .................................................. H02H 3/22
(52) U.S. Cl. .......................................... 361/111; 361/56
(58) Field of Search ............................. 361/54, 56, 58, 361/91.1, 91.7, 111, 117, 118, 127; 257/355, 356, 360, 361; 327/309, 310

(56) References Cited

U.S. PATENT DOCUMENTS

| | | | | | |
|---|---|---|---|---|---|
| 4,825,280 A | * | 4/1989 | Chen et al. | ................. | 257/659 |
| 5,610,790 A | * | 3/1997 | Staab et al. | .................... | 361/56 |
| 5,623,156 A | * | 4/1997 | Watt | ............................ | 257/355 |
| 5,721,656 A | * | 2/1998 | Wu et al. | ..................... | 361/56 |
| 5,991,134 A | * | 11/1999 | Tan et al. | ..................... | 361/56 |
| 6,046,897 A | * | 4/2000 | Smith et al. | ................. | 361/111 |
| 6,078,068 A | * | 6/2000 | Tamura | ..................... | 257/203 |
| 6,144,542 A | * | 11/2000 | Ker et al. | ................... | 361/111 |
| 6,385,021 B1 | * | 5/2002 | Takeda et al. | ................ | 361/56 |
| 6,448,123 B1 | * | 9/2002 | Lee et al. | ................... | 438/200 |
| 6,535,368 B2 | * | 3/2003 | Andresen et al. | ............. | 361/56 |
| 2003/0151877 A1 | * | 8/2003 | Young et al. | ............... | 361/212 |

* cited by examiner

Primary Examiner—Jonathan Salata
(74) Attorney, Agent, or Firm—Winston Hsu

(57) ABSTRACT

This invention provides an electrostatic discharge (ESD) protection circuit for protecting an internal circuit. The ESD protection circuit and the internal circuit are formed on a P-type substrate and electrically connect to each other. The ESD protection circuit has a plurality of N-wells in the P-type substrate and a common discharge bar connected to a power terminal. In each of the N-wells, a P+ diffusion region and an N+ diffusion region are formed, and the common discharge bar is electrically connected to all the N+ diffusion regions. Each of the P+ diffusions is electrically connected to a corresponding bonding pad. The ESD protection circuit is also capable of being formed on an N-type substrate with the same structure but opposite conductivity type.

14 Claims, 5 Drawing Sheets

ELECTROSTATIC DISCHARGE PROTECTION CIRCUIT

BACKGROUND OF THE INVENTION

1. Field of the Invention

The present invention relates to a protective circuit, and more particularly to an electrostatic discharge (ESD) protection circuit.

2. Description of the Prior Art

Electrostatic discharge (ESD) is a common phenomenon in semiconductor processes. Excess current brought by ESD enters an IC via an I/O pin for a very short time and destroys the internal circuit of the IC. In order to solve the problem, a protection circuit is usually installed between the internal circuit and the I/O pin. The protection circuit must activate before the pulse of an electrostatic discharge can reach the internal circuit, so as to instantly eliminate the high voltage of the pulse. Consequently, the destruction caused by ESD is reduced.

With the continuing scaling-down of semiconductor integrated circuit (IC) device dimensions, not only are channel lengths being shortened, gate oxide layers becoming thinner, and junction depths becoming shallower, but dopant concentrations of wells are also rising in deep submicron CMOS processes. All of these processes make IC products more susceptible to damage from electrostatic discharge (ESD). Consequently, more effective ESD protection circuits need to be built on-chip to discharge ESD-induced currents, and hence protect the IC against any ESD-related damage. In short, ESD robustness for IC products needs to be improved. To make an effective ESD protection circuit, an adequate ESD protection device must first be designed and manufactured into the ESD protection circuit. A very direct and effective way to increase the discharge path for ESD-induced current may be realized by enlarging the area of ESD protection device. However, the chip area occupied by the ESD protection device should not be excessive, lest the ESD protection device prevents further size reductions to the chip.

The prior art method of preventing electrostatic breakdown caused by electrostatic pulses is using MOSFET parasitic diodes as ESD protection devices. Please refer to FIG. 1. FIG. 1 is a schematic diagram of a prior art ESD protection circuit 20 used to protect an internal circuit 10. The ESD protection circuit 20 is electrically connected to the internal circuit 10 and a bonding pad 12, which is used as a transfer medium between the internal circuit 10 and external electronic signals. When static electricity discharges through the bonding pad 12, the ESD protection circuit 20 can protect the internal circuit 10 from excess electrostatic currents that could burn out the internal circuit 10. The ESD protection circuit 20 comprises a P-type metal-oxide semiconductor (PMOS) 22 and an N-type metal-oxide semiconductor (NMOS) 24. The drains of the PMOS 22 and NMOS 24 are tied together and electrically connected to the internal circuit 10 and the bonding pad 12 by a conducting wire 14. The source of the PMOS 22 is connected to both the gate of the PMOS 22 and a $V_{DD}$ power terminal. The source of the NMOS 24 is connected to both the gate of the NMOS 24 and a $V_{SS}$ grounding terminal. Furthermore, a first parasitic diode 26 is formed at the PMOS 22, and a second parasitic diode 28 is formed at the NMOS 24. When static electricity discharges through any two points of the $V_{DD}$ power terminal, the bonding pad 12 and the $V_{SS}$ grounding terminal, the generated electrostatic currents will be instantly discharged by the activation of the first parasitic diode 26, the activation of the second parasitic diode 28, snapback breakdown generated by the PMOS 22, or snapback breakdown generated by the NMOS 24. For example, when a foreign object simultaneously touches the $V_{DD}$ power terminal and the bonding pad 12 and makes the electric potential of the bonding pad 12 higher than the electric potential of the $V_{DD}$ power terminal, the first parasitic diode 26 will be turned on for instantly discharging electrostatic currents. Likewise, when a foreign object simultaneously touches the bonding pad 12 and $V_{SS}$ grounding terminal and makes the electric potential of the bonding pad 12 higher than the electric potential of the $V_{SS}$ grounding terminal, the NMSO 24 will generate snapback breakdown for instantly discharging electrostatic currents. Please refer to U.S. Pat. No. 5,182,580 for more detailed information about the above-mentioned phenomenon of snapback breakdown. For brevity, further details are omitted here. However, with the continued scaling-down of semiconductor device dimensions, it is more difficult to control the phenomenon of snapback breakdown. In addition, when designing an ESD protection circuit for protecting an internal circuit from damage caused by electrostatic currents and in order to avoid having the ESD protection circuit burn itself out due to excess electrostatic currents, many factors must be considered. For example, an interval between the drain and the gate, the use of a salicide block (SAB), and the change of doping concentrations of wells, etc, must all be considered.

SUMMARY OF THE INVENTION

It is therefore a primary objective of the claimed invention to provide a simple ESD protection circuit for adjusting to the continuing scaling-down of semiconductor device dimensions.

The ESD protection circuit according to the claimed invention is formed on a P-type substrate and electrically connects to an internal circuit formed on the P-type substrate for protecting the internal circuit. The ESD protection circuit has a plurality of N-wells and a common discharge bar connected to a power terminal. The N-wells are formed in the P-type substrate, and in each of the N-wells, a $P^+$ diffusion region and an $N^+$ diffusion region are formed. The common discharge bar is electrically connected to all the $N^+$ diffusion regions within the plurality of N-wells. Therein, each of the $P^+$ diffusion within an N-well is electrically connected to a corresponding bonding pad.

In addition, the ESD protection circuit is also capable of being formed on an N-type substrate. In this condition, the ESD protection circuit has a plurality of P-wells and a common discharge bar connected to a grounding terminal. The P-wells are formed in the N-type substrate, and in each of the P-wells, an $N^+$ diffusion region and a $P^+$ diffusion region are formed. The common discharge bar is electrically connected to all the $P^+$ diffusion regions within the plurality of P-wells. Therein, each of the $N^+$ diffusion within a P-well is electrically connected to a corresponding bonding pad.

Therefore, an equivalent diode is formed in each of the N-wells or P-wells. When static electricity discharges from two bonding pads into two N-wells or P-wells, one of the equivalent diodes in the two N-wells or P-wells will be turned on by forward bias, and breakdown will be generated in another equivalent diode. Furthermore, a discharge path is generated for instantly discharging the static electricity.

These and other objectives of the claimed invention will no doubt become obvious to those of ordinary skill in the art

DETAILED DESCRIPTION

Figure 1:
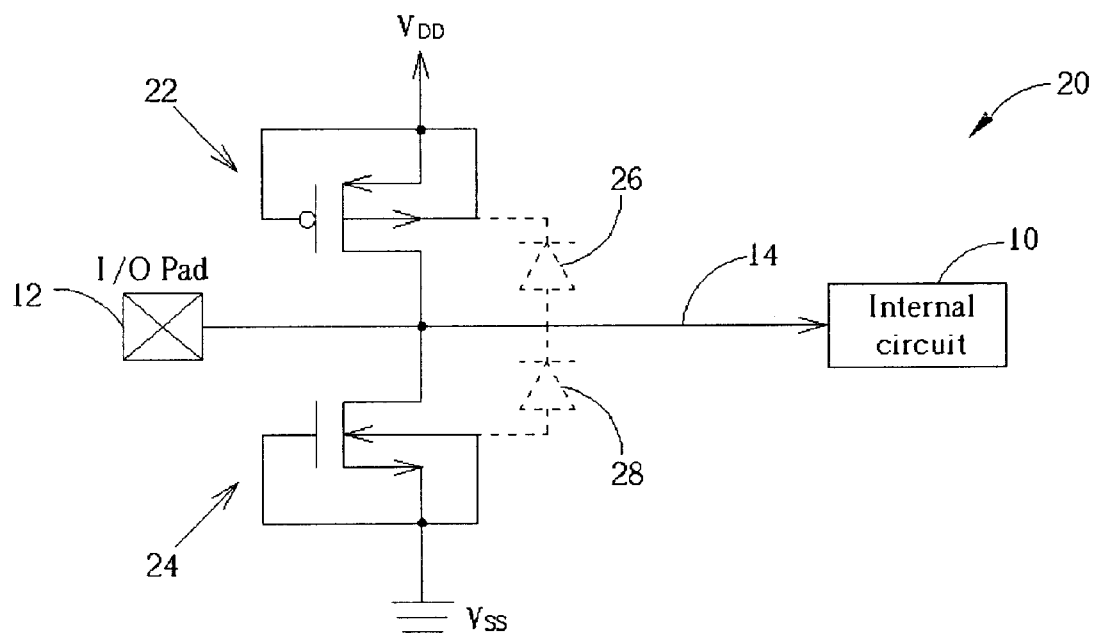
FIG. 1 is a schematic diagram of a prior art ESD protection circuit used to protect an internal circuit.
Figure 2:
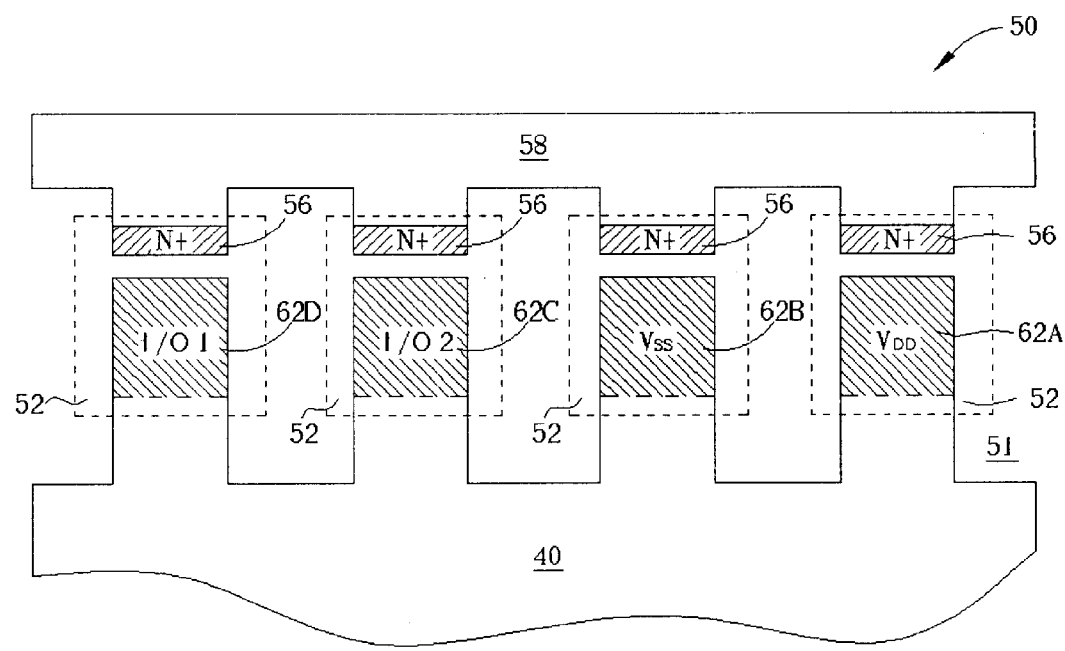
FIG. 2 is a wiring diagram of an internal circuit and an ESD protection circuit according to the first embodiment of the present invention.
Figure 3:
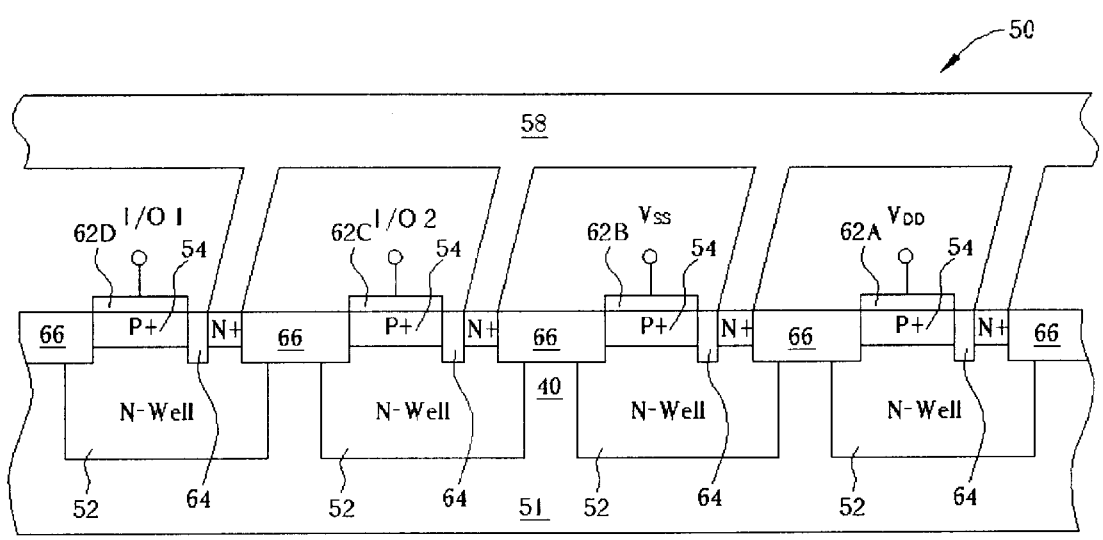
FIG. 3 is a cross-sectional diagram of the ESD protection circuit shown in FIG. 2.

Please refer to FIG. 2 and FIG. 3. FIG. 2 is a wiring diagram of an internal circuit 40 and an ESD protection circuit 50 according to the first embodiment of the present invention. FIG. 3 is a cross-sectional diagram of the ESD protection circuit 50 shown in FIG. 2. The ESD protection circuit 50 is electrically connected to the internal circuit and capable of protecting the internal circuit 40 from damage caused by external static electricity. Actually, the internal circuit 40 shown in FIG. 3 is simplified appropriately, and tens of thousands of transistors used in the internal circuit 40 are not depicted.

The ESD protection circuit 50 and the internal circuit 40 are formed on a P-type substrate 51. The ESD protection circuit 50 comprises a plurality of N-wells 52 and a common discharge bar 58. Each of the N-wells 52 is formed in the P-type substrate 51 and has a P$^+$ diffusion region 54 and an N$^+$ diffusion region 56. Therefore, an equivalent diode is formed in each of the N-wells 52. The common discharge bar 58, which is composed of metals or other conductive materials, is electrically connected to a power terminal pin V$_{DD}$ and the N$^+$ diffusion region 56 in each of the N-wells 52. The P$^+$ diffusion region 54 in each of the N-wells 52 is electrically connected to a corresponding bonding pad 62A, 62B, 62C, or 62D. Therein, the bonding pad 62A is electrically connected to the power supply pin V$_{DD}$, the bonding pad 62B is electrically connected to a grounding pin V$_{SS}$, the bonding pad 62C is electrically connected to a first Input/Output pin I/O 1, and the bonding pad 62D is electrically connected to a second Input/Output pin I/O 2. The internal circuit 40 obtains electrical power from the power supply pin V$_{DD}$ and is grounded via the grounding pin V$_{SS}$. The two Input/Output pins I/O 1 and I/O 2 are used to input signals to the internal circuit 40 or to output signals generated by the internal circuit 40. Therefore, electrical signals are capable of being transmitted to the internal circuit 40 via the Input/Output pins I/O 1, I/O 2 and the bonding pads 62C, 62D. For simplicity, FIG. 2 and FIG. 3 only show two Input/Output pins. However, the internal circuit 40 may be electrically connected to tens or hundreds of Input/Output pins.

Generally speaking, electrostatic currents are generated because of a foreign object touching at least two pins of the power supply pin V$_{DD}$, the grounding pin V$_{SS}$, the first Input/Output pin I/O 1 and the second Input/Output pin I/O 2. When the foreign object simultaneously touches two pins, an electrical loop is generated. However, when the foreign object touches only one of the pins, no electrostatic currents are generated because of the lack of an electrical loop. As mentioned-above, an equivalent diode is formed in each of the N-wells 52. Therefore, when a foreign object simultaneously touches any two of the pins V$_{DD}$, V$_{SS}$, I/O 1, and I/O 2, two equivalent diodes in the two corresponding N-wells 52 are turned on. One of the equivalent diodes is an equivalent forward biased diode, and another is an equivalent breakdown diode. A discharge path for instantly discharging static electricity is generated by the activation of two equivalent diodes in the two corresponding N-wells 52. Consequently, the threshold voltage of any two of the pins 62A, 62B, 62C, and 62D is the breakdown voltage between one N-well 52 and its P$^+$ diffusion region 54 plus the forward bias between another N-well 52 and its P$^+$ diffusion region 54. In conclusion, when a foreign object touches at least two of the plurality of the pins V$_{DD}$, V$_{SS}$, I/O 1, and I/O 2, static electricity inputted into the ESD protection circuit 50 will discharge through the two pins touched by the foreign object, the common discharge bar 58, and two corresponding N-wells 52 so that the amount of current flowing into the internal circuit 40 is reduced.

In addition, each of the P$^+$ diffusion regions 54 is located below and combines with the corresponding bonding pad 62A, 62B, 62C, or 62D. Consequently, each of the P$^+$ diffusion regions 54 overlaps the corresponding bonding pad 62A, 62B, 62C, or 62D, and the total area of the internal circuit 40 and the ESD protection circuit 50 is further reduced. As shown in FIG. 3, an isolation element 64 composed of silicon oxide is formed in each of the N-wells 52 for isolating the P$^+$ diffusion region 54 from the N$^+$ diffusion region 56. As well, a plurality of field oxide regions 66 are formed on the P-type substrate 51 for isolating the N-wells 52 from each other.

Figure 4:
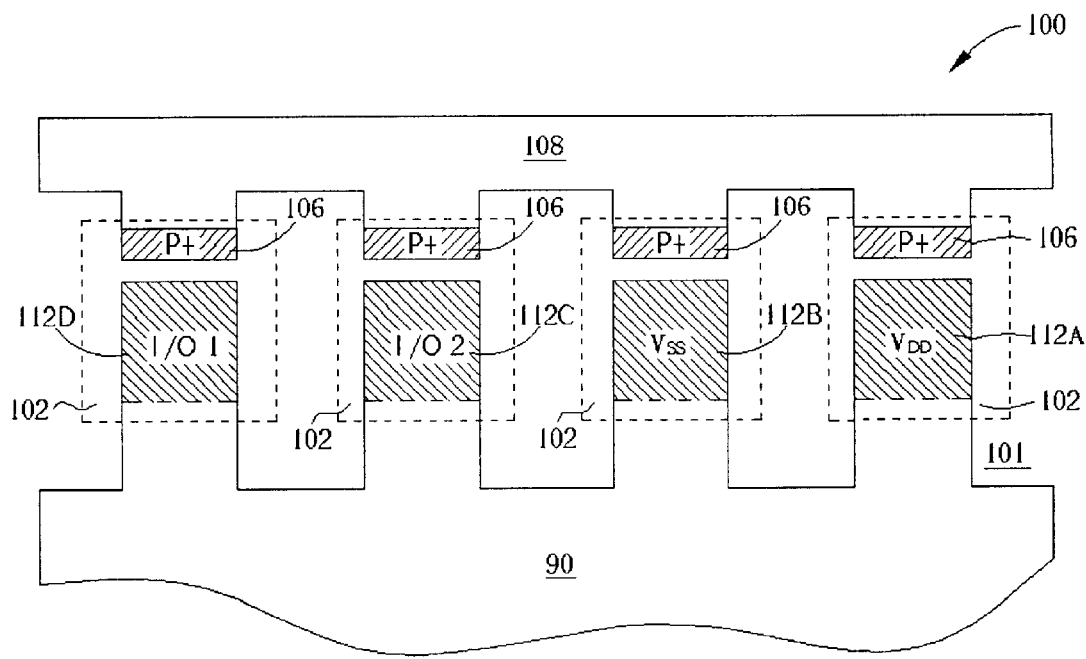
FIG. 4 is a wiring diagram of an internal circuit and an ESD protection circuit according to the second embodiment of the present invention.
Figure 5:
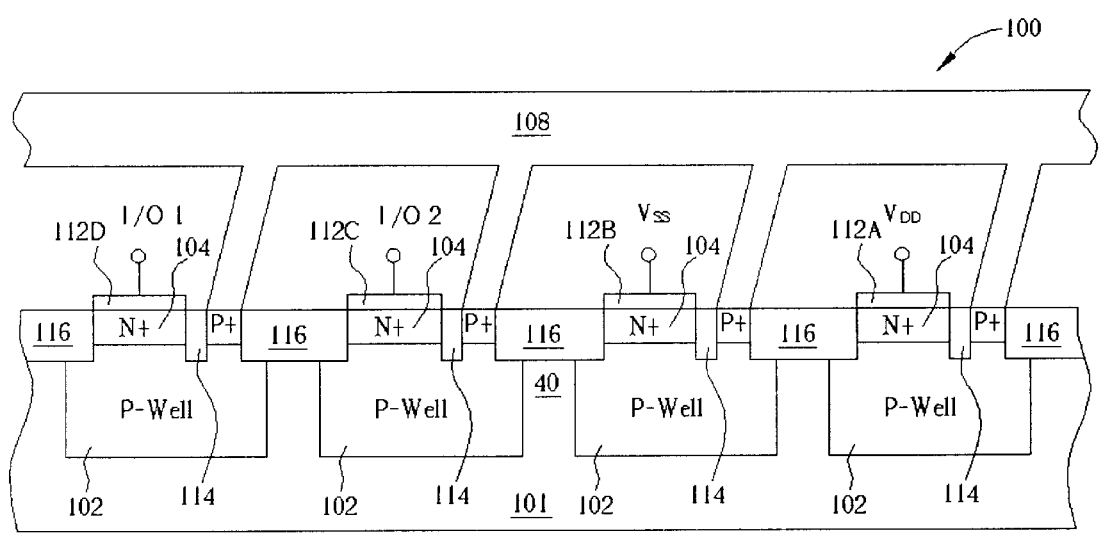
FIG. 5 is a cross-sectional diagram of the ESD protection circuit shown in FIG. 4.

Please refer to FIG. 4 and FIG. 5. FIG. 4 is a wiring diagram of an internal circuit 90 and an ESD protection circuit 100 according to the second embodiment of the present invention.

FIG. 5 is a cross-sectional diagram of the ESD protection circuit 100 shown in FIG. 4. In the first embodiment of the present invention, all related electrical devices are formed on a P-type substrate. However, in the second embodiment of the present invention, all related electrical devices are formed on an N-type 101 substrate. The structure of the ESD protection circuit 100 is similar to the structure of the ESD protection circuit 50. The ESD protection circuit 100 comprises a plurality of P-wells 102 and a common discharge bar 108. Each of the P-wells 102 is formed in the N-type substrate 101 and has an N$^+$ diffusion region 104 and a P$^+$ diffusion region 106. Therefore, an equivalent diode is formed in each of the P-wells 102. The common discharge bar 108, which is composed of metals or other conductive materials, is electrically connected to a grounding pin V$_{SS}$ and the P$^+$ diffusion region 106 in each of the P-wells 102. The N$^+$ diffusion region 104 in each of the P-wells 102 is electrically connected to a corresponding bonding pad 112A, 112B, 112C, or 112D. Therein, the bonding pad 112A is electrically connected to a power supply pin V$_{DD}$, the bonding pad 112B is electrically connected to the grounding pin V$_{SS}$, the bonding pad 112C is electrically connected to a first Input/Output pin I/O 1, and the bonding pad 112D is electrically connected to a second Input/Output pin I/O 2. The internal circuit 90 obtains electrical power from the power supply pin V$_{DD}$ and is grounded via the grounding pin V$_{SS}$. The two Input/Output pins I/O 1 and I/O 2 are used to input signals into the internal circuit 90 or to output signals generated by the internal circuit 90. As the operation principle of the ESD protection circuit 50 in the first embodiment of the present invention, the ESD protection circuit 100 also generates an electrostatic discharge path by the activation of two equivalent diodes formed in the two corresponding P-wells 102. Therein, the threshold voltage of any two of the bonding pads 112A, 112B, 112C, and 112D is the breakdown voltage between one P-well 102 and its N+ diffusion region 104 plus the forward bias between another P-well 102 and its N+ diffusion region 104.

Similar to the ESD protection circuit 50, each of the N+ diffusion regions 104 is located below and combines with the corresponding bonding pad 112A, 112B, 112C, or 112D. Consequently, each of the N+ diffusion regions 104 overlaps the corresponding bonding pad 112A, 112B, 112C, or 112D, and the total area of the internal circuit 90 and the ESD protection circuit 100 is further reduced. As shown in FIG. 5, an isolation element 114 composed of silicon oxide is formed in each of the P-wells 102 for isolating the N+ diffusion region 104 from the P+ diffusion region 106. As well, a plurality of field oxide regions 116 is formed on the N-type substrate 101 for isolating the P-wells 102 from each other.

In contrast to the prior art ESD protection circuit, which has difficulties controlling the snapback breakdown of transistors to instantly discharge static electricity because of the reduction in semiconductor device dimensions, the ESD protection circuit according to the present invention simply uses the operation principle of diodes. Therefore, the number of factors to consider when designing and manufacturing is considerably less.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An electrostatic discharge (ESD) protection circuit formed on a P-type substrate and electrically connected to an internal circuit on the P-type substrate for protecting the internal circuit from electrostatic discharge, the ESD protection circuit comprising:

a plurality of N-wells formed on the P-type substrate, each of the N-wells having a P+ diffusion region and an N+ diffusion region; and a common discharge bar electrically connecting the N+ diffusion regions in the plurality of N-wells;

wherein the P+ diffusion region in each of the N-wells electrically connects to a corresponding bonding pad.

2. The ESD protection circuit of claim 1 wherein each of the bonding pads is electrically connected to a corresponding pin, when a foreign object touches at least two pins of the ESD protection circuit, static electricity discharges through the two pins touched by the foreign object, the common discharge bar, and two corresponding N-wells.

3. The ESD protection circuit of claim 2 wherein in the two N-wells that contain the two P+ diffusion regions electrically connected to the two pins touched by the foreign object, an equivalent forward biased diode generates in one of the two N-wells, and an equivalent breakdown diode generates in another of the two N-wells.

4. The ESD protection circuit of claim 1 wherein each of the P+ diffusion regions combines with the corresponding bonding pad, and is located below the corresponding bonding pad.

5. The ESD protection circuit of claim 1 wherein an isolation element in each of the N-wells isolates the P+ diffusion region from the N+ diffusion region.

6. The ESD protection circuit of claim 1 wherein a plurality of field oxide regions are formed on the P-type substrate for isolating the N-wells from each other.

7. The ESD protection circuit of claim 1 wherein electrical signals are capable of being transmitted to the internal circuit via the bonding pads.

8. An electrostatic discharge (ESD) protection circuit formed on an N-type substrate and electrically connected to an internal circuit on the N-type substrate for protecting the internal circuit from electrostatic discharge, the ESD protection circuit comprising:

a plurality of P-wells formed on the N-type substrate, each of the P-wells having an N+ diffusion region and a P+ diffusion region; and a common discharge bar electrically connecting the P+ diffusion regions in the plurality of P-wells;

wherein the N+ diffusion region in each of the P-wells electrically connects to a corresponding bonding pad.

9. The ESD protection circuit of claim 8 wherein each of the bonding pads is electrically connected to a corresponding pin, when a foreign object touches at least two pins of the ESD protection circuit, static electricity discharges through the two pins touched by the foreign object, the common discharge bar, and two corresponding P-wells.

10. The ESD protection circuit of claim 9 wherein in the two P-wells that contain the two N+ diffusion regions electrically connected to the two pins touched by the foreign object, an equivalent forward biased diode generates in one of the two P-wells, and an equivalent breakdown diode generates in another of the two P-wells.

11. The ESD protection circuit of claim 8 wherein each of the N+ diffusion regions combines with the corresponding bonding pad, and is located below the corresponding bonding pad.

12. The ESD protection circuit of claim 8 wherein an isolation element in each of the P-wells isolates the N+ diffusion region from the P+ diffusion region.

13. The ESD protection circuit of claim 8 wherein a plurality of field oxide regions are formed on the N-type substrate for isolating the P-wells from each other.

14. The ESD protection circuit of claim 8 wherein electrical signals are capable of being transmitted to the internal circuit via the bonding pads.

* * * * *